(12) United States Patent
Furuichi et al.

(10) Patent No.: US 9,997,474 B2
(45) Date of Patent: Jun. 12, 2018

(54) WIRING BOARD AND SEMICONDUCTOR DEVICE

(71) Applicant: SHINKO ELECTRIC INDUSTRIES CO., LTD., Nagano (JP)

(72) Inventors: Jun Furuichi, Nagano (JP); Noriyoshi Shimizu, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days. days.

(21) Appl. No.: 15/477,414

(22) Filed: Apr. 3, 2017

(65) Prior Publication Data

US 2017/0352628 A1  Dec. 7, 2017

(30) Foreign Application Priority Data

Jun. 7, 2016  (JP) ................................ 2016-113277

(51) Int. Cl.
*H01L 23/00* (2006.01)
*H01L 21/48* (2006.01)
(Continued)

(52) U.S. Cl.
CPC .......... *H01L 23/562* (2013.01); *H01L 21/486* (2013.01); *H01L 21/4853* (2013.01); *H01L 21/4857* (2013.01); *H01L 21/565* (2013.01); *H01L 23/3114* (2013.01); *H01L 23/49822* (2013.01); *H01L 23/49827* (2013.01); *H01L 23/49838* (2013.01); *H01L 24/16* (2013.01);
(Continued)

(58) Field of Classification Search
CPC ............... H01L 23/562; H01L 23/3114; H01L 23/49822; H01L 23/49827; H01L 23/49838; H01L 21/4853; H01L 21/4857; H01L 21/486; H01L 21/565; H01L 24/16; H01L 2224/16227; H01L 2924/3511; H05K 1/0271; H05K 2201/029
See application file for complete search history.

(56) References Cited

U.S. PATENT DOCUMENTS

2010/0084163 A1 4/2010 Kodani et al.
2015/0179560 A1* 6/2015 Arisaka ................ H05K 1/0366
257/777
(Continued)

FOREIGN PATENT DOCUMENTS

JP  2010-092943  4/2010

*Primary Examiner* — Cheung Lee
*Assistant Examiner* — Stephen C Smith
(74) *Attorney, Agent, or Firm* — IPUSA, PLLC

(57) ABSTRACT

A wiring board includes a first insulating layer made of a single layer of non-photosensitive resin including a reinforcing member, a center position of the reinforcing member being positioned on a side toward a first surface with respect to a center of the first insulating layer in a thickness direction; a layered structure of a wiring layer and an insulating layer, stacked on the first surface of the first insulating layer; a through wiring provided to penetrate the first insulating layer, the through wiring and the first insulating layer forming a first concave portion at a second surface of the first insulating layer, in which the second end surface of the through wiring is exposed; and a pad for external connection formed at the second surface of the first insulating layer at a position corresponding to the through wiring and having a second concave portion.

15 Claims, 13 Drawing Sheets

(51) Int. Cl.
*H05K 1/02* (2006.01)
*H01L 21/56* (2006.01)
*H01L 23/498* (2006.01)
*H01L 23/31* (2006.01)

(52) U.S. Cl.
CPC .. *H05K 1/0271* (2013.01); *H01L 2224/16227* (2013.01); *H01L 2924/3511* (2013.01); *H05K 2201/029* (2013.01)

(56) References Cited

U.S. PATENT DOCUMENTS

2015/0181703 A1* 6/2015 Tanaka ................ H05K 1/0298
 361/748
2016/0020163 A1* 1/2016 Shimizu ............ H01L 23/49822
 361/768

* cited by examiner

WIRING BOARD AND SEMICONDUCTOR DEVICE

CROSS-REFERENCE TO RELATED APPLICATION

The present application is based on and claims the benefit of priority of Japanese Priority Application No. 2016-113277 filed on Jun. 7, 2016, the entire contents of which are hereby incorporated by reference.

FIELD

The present invention relates to a wiring board and a semiconductor device.

BACKGROUND

Conventionally, a coreless wiring board is known. In the coreless wiring board, for example, an insulating layer and a wiring layer are alternately stacked, electrodes to be connected to a semiconductor chip are exposed at one side, and pads for external connection that are selectively exposed from a solder resist layer are formed at another side. The pads for external connection are connected to a mounting substrate such as a mother board by solder, for example (see Patent Document 1, for example).

As the coreless wiring board does not include a core, its rigidity is not sufficient and large warping may be generated in the wiring board. If warping is generated in the wiring board, there is a problem that it is difficult to connect the pads for external connection to the mounting substrate by the solder due to positional shifts between the pads for external connection and the mounting substrate.

PATENT DOCUMENT

[Patent Document 1] Japanese Laid-open Patent Publication No. 2010-92943

SUMMARY

The present invention is made in light of the above problems, and provides a wiring board capable of reducing warping, and suppressing lowering of reliability in connection even when an alignment between pads for external connection and a mounting substrate is shifted.

According to an embodiment, there is provided a wiring board including a first insulating layer made of a single layer of non-photosensitive resin including a reinforcing member, the first insulating layer including a first surface and a second surface opposite to the first surface, a center position of the reinforcing member being positioned on a side toward the first surface with respect to a center of the first insulating layer in a thickness direction of the first insulating layer; a layered structure, in which a wiring layer and a second insulating layer are stacked, stacked on the first surface of the first insulating layer; a through wiring provided to penetrate the first insulating layer, the through wiring including a first end surface and a second end surface opposite to the first end surface, the first end surface of the through wiring being exposed from the first surface of the first insulating layer to be connected to the wiring layer, the through wiring and the first insulating layer forming a first concave portion at the second surface of the first insulating layer, in which the second end surface of the through wiring is exposed at a position concaved from the second surface of the first insulating layer, the second end surface of the through wiring forming a bottom surface of the first concave portion and the first insulating layer forming an inner side surface of the first concave portion; and a pad for external connection formed on the second surface of the first insulating layer at a position corresponding to the through wiring, the pad for external connection being formed along the bottom surface and the inner side surface of the first concave portion, and extending on the second surface of the first insulating layer around the first concave portion, only the pad for external connection being formed on the second surface of the first insulating layer, the pad for external connection having a second concave portion formed so as to be concaved toward the through wiring within a part of the pad for external connection extended on the second surface of the insulating layer.

BRIEF DESCRIPTION OF DRAWINGS

Other objects, features and advantages of the present invention will become more apparent from the following detailed description when read in conjunction with the accompanying drawings.

DESCRIPTION OF EMBODIMENTS

Figure 1A:
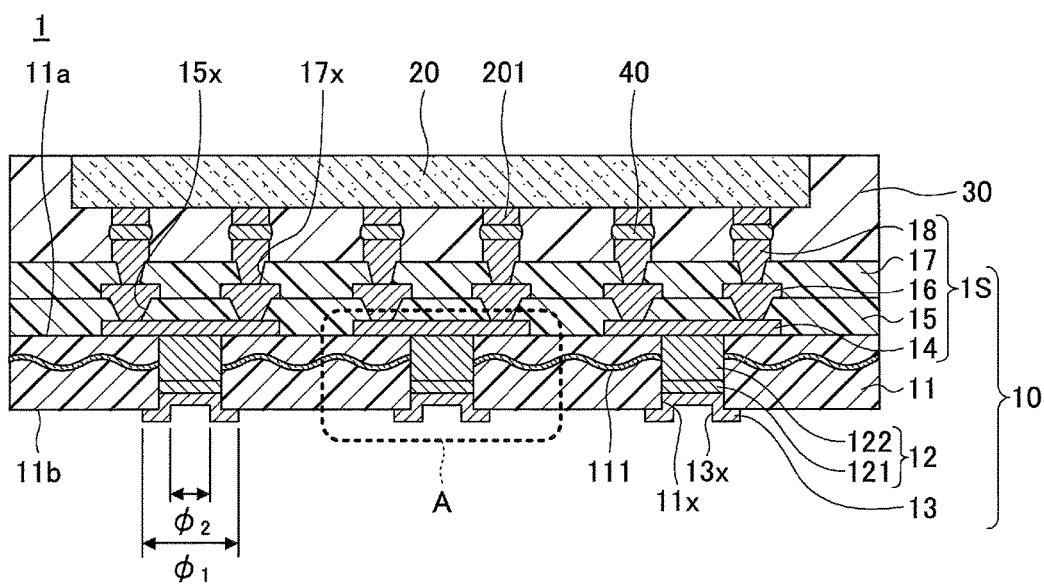
FIG. 1A to FIG. 1C are views illustrating an example of a semiconductor device of a first embodiment.
Figure 1B:
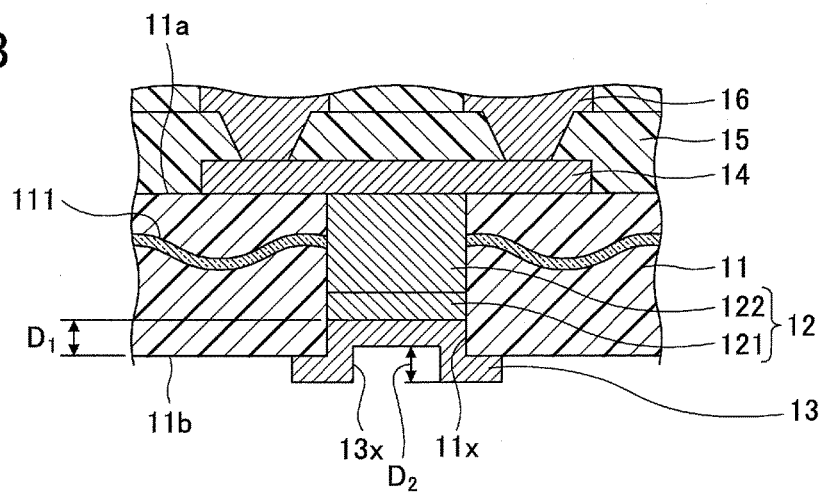
Figure 1C:
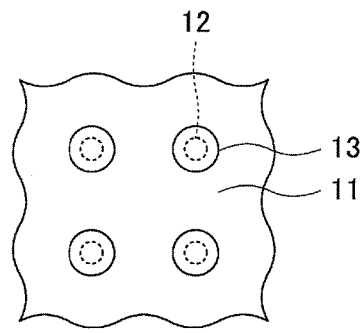

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations may not be repeated.

First Embodiment (Structures of Wiring Board and Semiconductor Device of First Embodiment)

FIG. 1A to FIG. 10 are views illustrating an example of a semiconductor device 1 of a first embodiment. FIG. 1A is a cross-sectional view, FIG. 1B is an enlarged cross-sectional view of a portion "A" in FIG. 1A, and FIG. 10 is a partial bottom view illustrating a part near pads for external connection 13 (hereinafter, simply referred to as "pads 13") in a reduced manner.

With reference to FIG. 1A, the semiconductor device 1 includes a wiring board 10, a semiconductor chip 20 and a sealing resin 30. The semiconductor chip 20 is mounted on the wiring board 10 and is sealed by the sealing resin 30.

The wiring board 10 includes an insulating layer 11, through wirings 12, the pads 13, a wiring layer 14, an insulating layer 15, a wiring layer 16, an insulating layer 17 and a wiring layer 18. The wiring layer 14, the insulating layer 15, the wiring layer 16, the insulating layer 17 and the wiring layer 18 compose a layered structure 1S, which will be described later in detail. Here, the insulating layer 11 is a typical example of "a first insulating layer".

In this embodiment, a semiconductor chip 20 side of the semiconductor device 1 is referred to as an upper side, one side or a first side, and a side where the pads 13 are formed of the semiconductor device 1 is referred to as a lower side, the other side or a second side. Further, a surface of each component at the semiconductor chip 20 side is referred to as an upper surface, one surface or a first surface, and a surface of each component at the side where the pads 13 are formed is referred to as a lower surface, the other surface or a second surface. However, the semiconductor device 1 may be used in an opposite direction or may be used at an arbitrary angle. Further, in this embodiment, "in a plan view" means that an object is seen in a direction that is normal to one surface 11a of the insulating layer 11, and a "plan shape" means a shape of an object seen in the direction that is normal to the one surface 11a of the insulating layer 11.

The insulating layer 11 is an insulating layer of a single layer made of non-photosensitive resin including a reinforcing member 111. More specifically, the insulating layer 11 is so-called glass epoxy-based resin obtained by impregnating the reinforcing member 111 such as a glass cloth (glass woven cloth) with thermosetting non-photosensitive resin whose main constituent is epoxy-based resin and curing it, for example.

The thermosetting non-photosensitive resin is not limited to the epoxy-based resin, and other insulating resin such as polyimide-based resin or cyanate-based resin may be used, for example. The insulating layer 11 may include filler such as silica or alumina, for example. The thickness of the insulating layer 11 may be about 25 to 35 μm, for example. The reinforcing member 111 is provided such that its center position is shifted from a center position of the insulating layer 11 in the thickness direction toward the one surface 11a of the insulating layer 11. In other words, the center position of the reinforcing member 111 is positioned on a side toward the one surface 11a with respect to the center of the insulating layer 11 in a thickness direction of the insulating layer 11. It is preferable that the reinforcing member 111 is provided such that its center position matches a center position of a combination of the insulating layer 11 and the layered structure 1S in the thickness direction in order to reduce warping of the wiring board 10.

The glass cloth that composes the reinforcing member 111 may be formed by plain weave of glass fiber bundles aligned in a predetermined direction and glass fiber bundles aligned in a direction perpendicular to the predetermined direction in a grid pattern, for example. The glass fiber bundle may have a width about a few hundred micrometers by bundling a plurality of glass fibers each of whose diameter is about a few micrometers, for example.

The way of weaving the glass fiber bundles is not limited to the plain weave, and may be satin weave, twill weave or the like. Further, the glass fiber bundles may be woven in a predetermined angle other than 90°. Further, instead of the glass cloth using the glass fiber bundles, woven cloth, nonwoven cloth or the like of glass fiber, carbon fiber, alamid fiber or the like may be used.

The through wirings 12 that penetrate the insulating layer 11 are formed in the insulating layer 11. The through wiring 12 may have a columnar shape whose diameter is about 200 to 300 μm, for example. The through wiring 12 may have a structure in which a metal layer 121 and a metal layer 122 are stacked, for example. For the material of the metal layer 121 and the metal layer 122, copper (Cu) or the like may be used, for example.

One end surface of each of the through wirings 12 (one end surface of the metal layer 122) is exposed from the one surface 11a of the insulating layer 11, and is connected to the wiring layer 14. Another end surface of each of the through wirings 12 (another end surface of the metal layer 121) is exposed at a position that is concaved from another surface 11b of the insulating layer 11, and a first concave portion 11x is formed in which the other end surface of the respective through wiring 12 forms a bottom surface and the insulating layer 11 forms an inner side surface. In other words, each of the through wirings 12 and the insulating layer 11 form the first concave portion 11x at the other surface of the insulating layer 11, and the other end surface of the respective through wiring 12 is exposed in the first concave portion 11x.

The pads 13 are formed at the other surface 11b of the insulating layer 11 at positions corresponding to the through wirings 12, respectively. Here, only the through wirings 12 and the pads 13 are formed in the insulating layer 11.

Each combination of the through wiring 12 and the pad 13 is formed to have an independent post shape (column shape), and no wiring patterns for electrically connecting the through wirings 12 are formed in the insulating layer 11. The through wirings 12 may be electrically connected via the wiring layer 14, if necessary, for example.

The pad 13 is formed along the bottom surface and the inner side surface of the first concave portion 11x, and extends from the inner side surface of the first concave portion 11x to the other surface 11b of the insulating layer 11 around the first concave portion 11x. A second concave portion 13x, which is concaved toward the through wiring 12, is formed at inside of a portion of the pad 13 that extends at the other surface 11b of the insulating layer 11. In other words, a portion of the other surface of the pad 13 formed on the other end surface of the through wiring 12 is positioned closer to the one surface 11a of the insulating layer 11 than a portion of the other surface of the pad 13 formed on the other surface 11b of the insulating layer 11. The depth $D_1$ of the first concave portion 11x and the depth $D_2$ of the second concave portion 13x may be about 10 to 50 nm, respectively.

For the material of the pads 13, for example, copper or the like may be used. The thickness of the pads 13 may be, for example, about 10 to 30 μm. The shape of the pad 13 seen from the other surface 11b of the insulating layer 11 side may be, for example, a circular shape. In such a case, the diameter $\varphi_1$ of the pad 13 may be, for example, about 200 to 300 μm. Further, the diameter $\varphi_2$ of a bottom surface of the second concave portion 13x may be, for example, about 150 to 250 μm. The diameter of the pad 13 is larger than the diameter of the through wiring 12.

The layered structure 1S in which the wiring layer 14, the insulating layer 15, the wiring layer 16, the insulating layer 17 and the wiring layer 18 are stacked in this order is formed at the one surface 11a of the insulating layer 11. Each of the wiring layers 14, 16 and 18 that constitutes the layered structure 1S is a fine wiring layer (a wiring layer including a high density wiring pattern). Here, the fine wiring layer means a wiring layer whose line/space (line and space) is less than or equal to 10 μm/10 μm. Here, a thickness of the wiring layer of the layered structure 1S is greater than a thickness of the through wiring 12 formed in the insulating layer 11.

The line of the line/space expresses a wiring width and the space of the line/space expresses a space (wiring space) between adjacent wirings. For example, when the line/space is expressed as 10 μm/10 μm, it means that the wiring width of the wiring is 10 μm, and the space between the adjacent wirings is 10 μm.

The one surface 11a of the insulating layer 11 and the one end surface of each of the through wirings 12 are polished surfaces. The one surface 11a of the insulating layer 11 and the one end surface of each of the through wirings 12 are substantially flush with each other. The roughness of the one surface 11a of the insulating layer 11 may be, for example, about Ra 15 to Ra 40 nm. On the other hand, the roughness of the other surface 11b of the insulating layer 11 is, for example, about Ra 300 to Ra 400 nm.

As such, the one surface 11a of the insulating layer 11 is smoother than the other surface 11b of the insulating layer 11. By reducing the roughness of the one surface 11a of the insulating layer 11 and improving its smoothness, the fine wiring layer such as the wiring layer 14 can be easily formed on the one surface 11a of the insulating layer 11.

The wiring layer 14 is a wiring pattern that is formed at the one surface 11a of the insulating layer 11. The wiring layer 14 is electrically connected to the pads 13 via the through wirings 12. For the material of the wiring layer 14, for example, copper (Cu) or the like may be used. The thickness of the wiring layer 14 may be, for example, about 1 to 3 μm. The line/space of the wiring layer 14 may be, for example, about 2 μm/2 μm to 5 μm/5 μm.

The insulating layer 15 is formed at the one surface 11a of the insulating layer 11 such that to cover the wiring layer 14. For the material of the insulating layer 15, for example, insulating photosensitive resin whose main constituent is phenol-based resin, polyimide-based resin or the like may be used. The thickness of the insulating layer 15 may be, for example, about 5 to 10 μm. The insulating layer 15 may include filler such as silica or alumina.

The wiring layer 16 is formed at one side of the insulating layer 15, and is electrically connected to the wiring layer 14. The wiring layer 16 includes via wirings that are filled in via holes 15x penetrating the insulating layer 15 and exposing an upper surface of the wiring layer 14, and a wiring pattern formed at an upper surface of the insulating layer 15. The material and the thickness of the wiring layer 16, the line/space of the wiring pattern that constitutes the wiring layer 16 and the like may be, for example, the same as those of the wiring layer 14.

The insulating layer 17 is formed at the upper surface of the insulating layer 15 such that to cover the wiring layer 16. The material and the thickness of the insulating layer 17 may be, for example, the same as those of the insulating layer 15. The insulating layer 17 may include filler such as silica or alumina.

The wiring layer 18 is formed at one side of the insulating layer 17, and is electrically connected to the wiring layer 16. The wiring layer 18 is formed into metal posts or pads which protrude from an upper surface of the insulating layer 17 by being filled in via holes 17x penetrating the insulating layer 17 and exposing an upper surface of the wiring layer 16. For the material of the wiring layer 18, for example, copper (Cu) or the like may be used. The protruding amount of the wiring layer 18 from the upper surface of the insulating layer 17 is about 50 μm, for example.

A surface treatment layer (not illustrated in the drawings) may be formed at a surface (the upper surface and a side surface or only the upper surface) of the wiring layer 18. As an example of the surface treatment layer, an Au layer, a Ni/Au layer (a metal layer in which a Ni layer and an Au layer are stacked in this order), a Ni/Pd/Au layer (a metal layer in which a Ni layer, a Pd layer and an Au layer are stacked in this order) or the like may be used. Alternatively, the surface treatment layer may be formed by performing an antioxidation process such as an Organic Solderability Preservative (OSP) process at the surface (the upper surface and the side surface) of the wiring layer 18.

The semiconductor chip 20 is flip-chip mounted on the layered structure 1S of the wiring board 10 in a face-down manner (a circuit forming surface faces the wiring board 10 side). The semiconductor chip 20 includes a semiconductor integrated circuit (not illustrated in the drawings) or the like formed on a thinned semiconductor substrate (not illustrated in the drawings) made of silicon or the like, for example. Electrodes 201 that are electrically connected to the semiconductor integrated circuit (not illustrated in the drawings) are formed on the semiconductor substrate (not illustrated in the drawings).

The electrodes 201 of the semiconductor chip 20 are electrically connected to the wiring layer 18, which is the uppermost wiring layer of the layered structure 1S of the wiring board 10, via bumps 40, respectively. The bumps 40 are, for example, solder bumps. For the material of the solder bump, alloy containing Pb (lead), alloy of Sn and Cu, alloy of Sn and Ag, alloy of Sn, Ag and Cu or the like may be used, for example.

The sealing resin 30 that covers an upper surface of the layered structure 1S of the wiring board 10 and the semiconductor chip 20 is formed on the layered structure 1S of the wiring board 10. Here, a back surface (a surface opposite to the circuit forming surface) of the semiconductor chip 20 is exposed from the sealing resin 30. With this, radiation property of the semiconductor chip 20 can be improved. For the material of the sealing resin 30, epoxy-based resin or the like (so-called mold resin), which has high rigidity, may be used, for example. The rigidity of the epoxy-based resin or the like may be adjusted by composition of the resin itself, a type or the amount of filler contained in the resin, or the like, for example.

A plurality of semiconductor chips may be mounted on the wiring board 10, and a passive element (a resistor, a capacitor, an inductor or the like) may be mounted on the wiring board 10 in addition to the semiconductor chip 20.

(Method of Manufacturing Semiconductor Device of First Embodiment)

Next, a method of manufacturing the semiconductor device 1 of the first embodiment is described. FIG. 2A to FIG. 5C are views illustrating an example of manufacturing steps of the semiconductor device 1 of the first embodiment. Although an example of manufacturing steps in which a single semiconductor device is manufactured is described in this embodiment, another example of manufacturing steps, in which a part corresponding to a plurality of semiconductor devices is firstly manufactured and then, the plurality of semiconductor devices are obtained by individualizing the part, may be alternatively used.

Figure 2A:
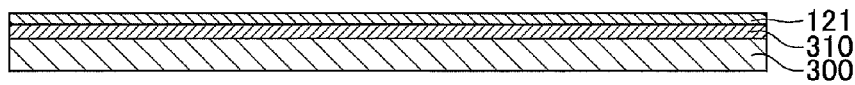
FIG. 2A to FIG. 2G are views (No. 1) illustrating an example of manufacturing steps of the semiconductor device of the first embodiment.

First, in a step illustrated in FIG. 2A, a support body 300 is prepared, and a metal layer 310 and the metal layer 121 are stacked on one surface of the support body 300 in this order by sputtering, electrolytic plating or the like. The thickness of the support body 300 may be about 35 to 70 μm, for example. For the support body 300, for example, a metal plate, a metal foil or the like may be used. In this embodiment, an example is described in which a copper foil is used as the support body 300.

For the material of the metal layer 310, for example, titanium, nickel, chromium or the like may be used. In this embodiment, an example is described in which titanium is used as the metal layer 310. The thickness of the metal layer 310 may be, for example, about 10 to 50 nm. For the material of the metal layer 121, for example, copper or the like may be used. The thickness of the metal layer 121 may be, for example, about 100 to 500 nm. The metal layer 310 functions as an adhesion layer that improves adhesion between the support body 300 and the metal layer 121. Furthermore, as will be described later, the metal layer 310 is used for forming first concave portions 11x.

Figure 2B:
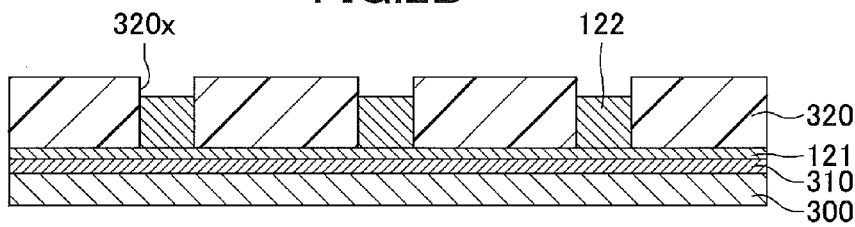

Next, in a step illustrated in FIG. 2B, a resist layer 320 (dry film resist or the like) provided with open portions 320x at forming areas for the through wirings 12 is formed on the metal layer 121. Then, the metal layer 122 made of copper or the like is formed on the metal layer 121 that is exposed in each of the open portions 320x by an electrolytic plating method using the metal layer 121 as a power supply layer. The thickness of the metal layer 122 may be, for example, about 10 to 60 μm. After forming the metal layer 122, the resist layer 320 is removed by peeling solution.

Figure 2C:
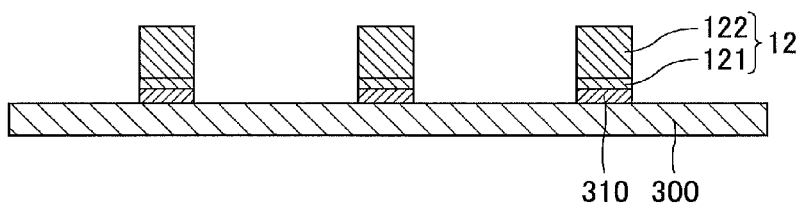
Figure 2D:
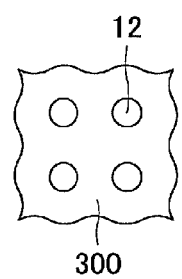

Next, in steps illustrated in FIG. 2C and FIG. 2D, for example, the metal layers 121 and 310 at parts not covered by the metal layer 122 is removed by etching using the metal layer 122 as a mask. With this, the metal layer 310 (metal layer portions) and the through wirings 12 including the metal layers 121 and 122 are formed in a stacked manner at predetermined areas at the one surface of the support body 300. Here, FIG. 2D is a plan view illustrating a part near the through wirings 12 of FIG. 2C in a reduced manner.

The through wirings 12 are formed into independent posts, and no wiring patterns for electrically connecting the through wirings 12 are formed. If necessary, the through wirings 12 may be electrically connected with each other by the wiring layer 14, which will be described later, for example.

When the metal layer 121 is made of copper, for example, the metal layer 121 can be removed by acidic aqueous solution such as SPM (Sulfuric Acid-Hydrogen Peroxide Mixture, mixed solution of sulfuric acid and hydrogen peroxide solution). The metal layer 310 made of titanium can be removed by dry etching using etching gas such as carbon tetrafluoride ($CF_4$), for example. Further, when the metal layer 121 and the support body 300 are made of copper, the metal layer 310 made of titanium can be selectively etched with respect to the metal layer 121 and the support body 300 by wet etching using potassium hydroxide (KOH) based etching solution, for example. In such a case, the support body 300 functions as an etching stopper layer.

Figure 2E:
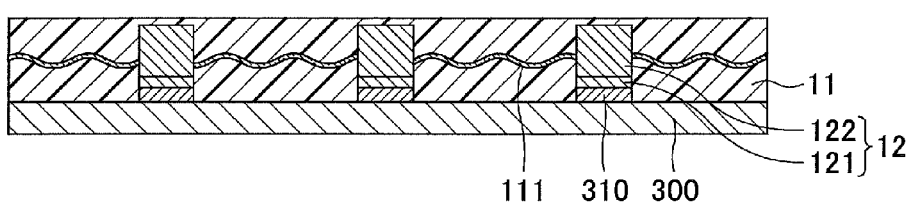

Next, in a step illustrated in FIG. 2E, the insulating layer 11 made of non-photosensitive resin, which is a single layer containing the reinforcing member 111, is formed on the one surface of the support body 300 such that to cover the side surface of the metal layer 310 and the one end surface and the side surface of each of the through wirings 12. The insulating layer 11 may be formed by laminating a resin film on the one surface of the support body 300 such that to cover the side surface of the metal layer 310 and the one end surface and the side surface of each of the through wirings 12, and thereafter, curing the resin film by heating it while pressing it, for example. Here, for the resin film, a resin film in which the reinforcing member 111 such as a glass cloth is impregnated with thermosetting resin such as epoxy-based resin may be used, for example. At this stage, the center position of the reinforcing member 111 substantially matches the center position of the insulating layer 11 in the thickness direction.

Figure 2F:
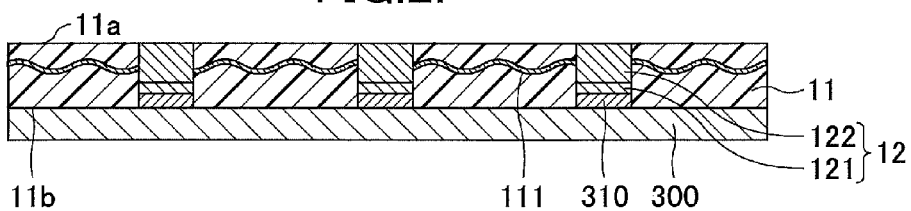

Next, in a step illustrated in FIG. 2F, the one surface 11a of the insulating layer 11 and the one end surface of each of the through wirings 12 are polished to expose the one end surface of each of the through wirings 12 from the one surface 11a of the insulating layer 11. With this, the reinforcing member 111 is positioned such that its center position is shifted from the center position of the insulating layer 11 in the thickness direction toward the one surface 11a of the insulating layer 11. It is preferable that the polished amount of the insulating layer 11 is adjusted such that the center position of the reinforcing member 111 matches the center position of a combination of the insulating layer 11 and the layered structure 1S, when the layered structure 1S is formed in the following step, in the thickness direction.

Grinding may be performed by a chemical mechanical polishing method (CMP method) or the like, for example. The roughness of the one surface 11a of the insulating layer 11 before performing the CMP method or the like (before polishing) may be about Ra 300 to 400 nm, for example. Then, the roughness of the one surface 11a of the insulating layer 11 (polished surface) after performing the CMP method or the like may be about Ra 15 to 40 nm, for example.

Figure 2G:
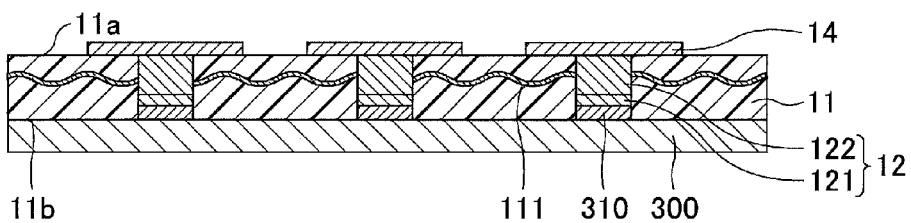

Next, in a step illustrated in FIG. 2G, the wiring layer 14 is formed. The wiring layer 14 may be formed by a semi-additive method, for example. Specifically, first, a seed layer that continuously covers the one surface 11a of the insulating layer 11 and the one end surface of each of the through wirings 12 by a sputtering method or an electroless plating method. For the material of the seed layer, a stacked layer film in which a copper (Cu) film is formed on a titanium (Ti) film may be used, for example. The thickness of the seed layer may be, for example, about 100 to 200 nm.

Next, a resist layer provided with open portions corresponding to the wiring layer 14 is formed on the seed layer by coating photosensitive resist, exposing and developing it. Next, an electrolytic plating layer made of copper (Cu) or the like is formed in the open portions of the resist layer by an electrolytic plating method using the seed layer as a power supply layer. Subsequently, after removing the resist layer, a part of the seed layer that is not covered by the electrolytic plating layer is removed by etching using the electrolytic plating layer as a mask. With this, the wiring layer 14 in which the electrolytic plating layer is stacked on the seed layer is formed. The thickness of the wiring layer 14 may be, for example, about 1 to 3 µm. The line/space of the wiring layer 14 may be, for example, about 2 µm/2 µm to 5 µm/5 µm.

Figure 3A:
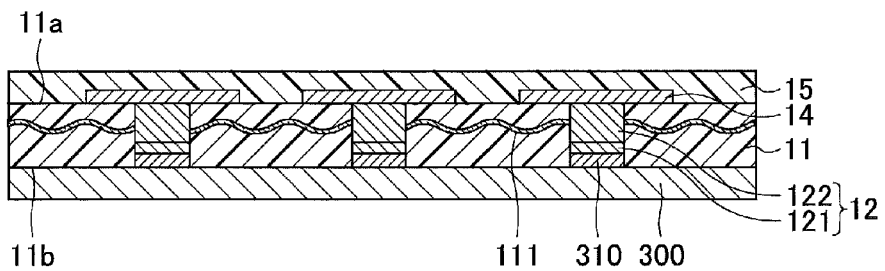
FIG. 3A to FIG. 3E are views (No. 2) illustrating an example of manufacturing steps of the semiconductor device of the first embodiment.

Next, in a step illustrated in FIG. 3A, the insulating layer 15 is formed at the one surface 11a of the insulating layer 11 such that to cover the wiring layer 14. For the material of the insulating layer 15, insulating photosensitive resin whose main constituent is phenol-based resin, polyimide-based resin or the like may be used, for example. The thickness of the insulating layer 15 may be, for example, about 5 to 10 µm. The insulating layer 15 may include filler such as silica or alumina. When liquid or paste resin is used as the material of the insulating layer 15, the liquid or paste resin is coated on the one surface 11a of the insulating layer 11 such that to cover the wiring layer 14 by a spin coat method or the like. When the film resin is used as the material of the insulating layer 15, film resin is laminated at the one surface 11a of the insulating layer 11 such that to cover the wiring layer 14.

Figure 3B:
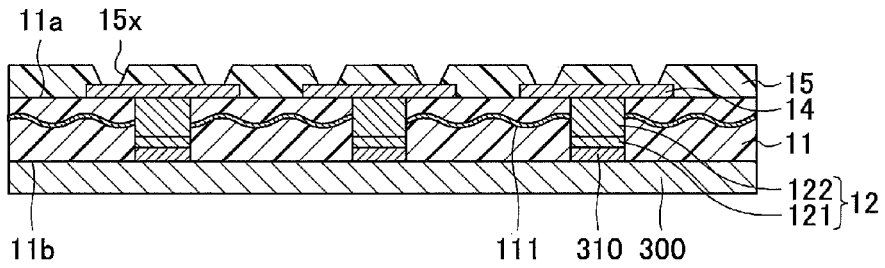

Next, in a step illustrated in FIG. 3B, via holes 15x each penetrating the insulating layer 15 to expose the upper surface of the wiring layer 14 are formed by exposing and developing the insulating layer 15.

Figure 3C:
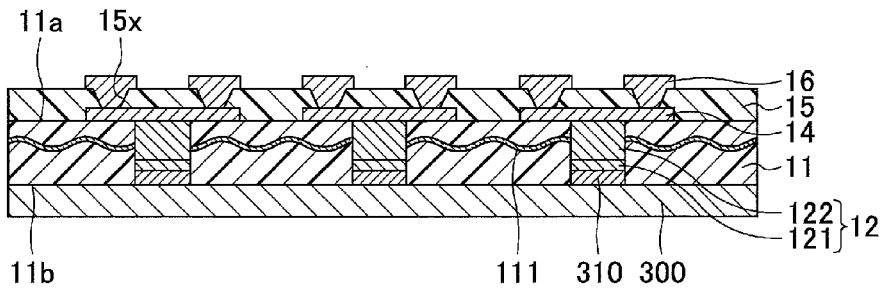

Next, in a step illustrated in FIG. 3C, the wiring layer 16 is formed at one side of the insulating layer 15. Similar to the wiring layer 14, the wiring layer 16 may be formed by a semi-additive method. The wiring layer 16 includes a via wiring filled in each of the via holes 15x penetrating the insulating layer 15 and exposing the upper surface of the wiring layer 14, and a wiring pattern formed on the upper surface of the insulating layer 15. The material and the thickness of the wiring layer 16, the line/space of the wiring pattern of the wiring layer 16 and the like are the same as those of the wiring layer 14, for example.

Figure 3D:
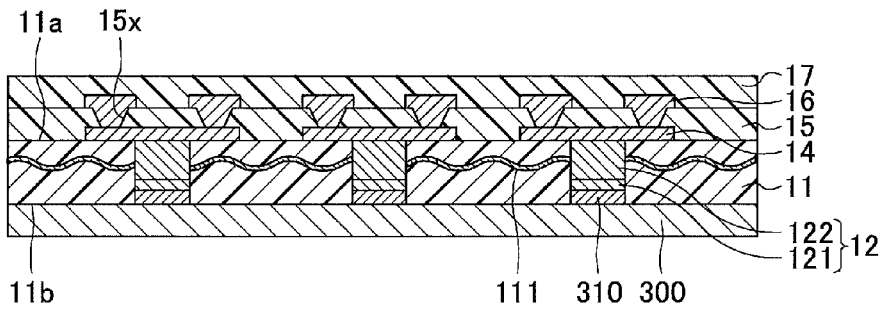

Next, in a step illustrated in FIG. 3D, similar to the step of FIG. 3A, the insulating layer 17 is formed on the one surface of the insulating layer 15 such that to cover the wiring layer 16.

Figure 3E:
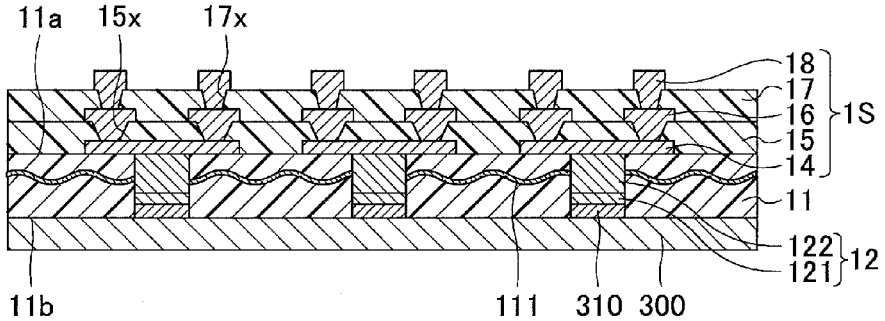

Next, in a step illustrated in FIG. 3E, similar to the step of FIG. 3B, via holes 17x are formed in the insulating layer 17. Then, the wiring layer 18 is formed at one side of the insulating layer 17. By the above described steps, the layered structure 1S is formed on the one surface 11a of the insulating layer 11.

Similar to the wiring layer 14, the wiring layer 18 may be formed by a semi-additive method. The wiring layer 18 is formed into metal posts or pads which protrude from the upper surface of the insulating layer 17 by being filled in the via holes 17x penetrating the insulating layer 17 and exposing the upper surface of the wiring layer 16. The material of the wiring layer 18 may be, for example, copper (Cu) or the like. The protruding amount of the wiring layer 18 from the upper surface of the insulating layer 17 may be about 50 µm, for example.

Here, the surface treatment layer may be formed at the surface (the upper surface and the side surface, or only the upper surface) of the wiring layer 18 by an electroless plating method or the like. Further, the surface treatment layer may be formed at the surface (the upper surface and the side surface) of the wiring layer 18 by performing an antioxidation process such as an Organic Solderability Preservative (OSP) process.

Figure 4A:
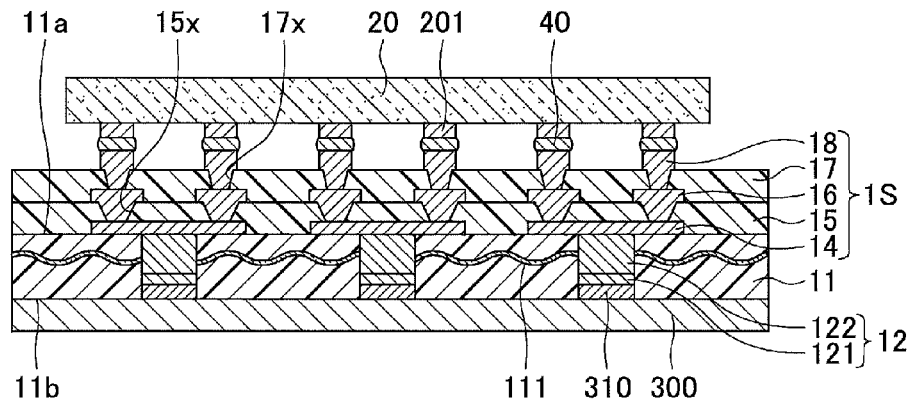
FIG. 4A to FIG. 4C are views (No. 3) illustrating an example of manufacturing steps of the semiconductor device of the first embodiment.

Next, in a step illustrated in FIG. 4A, the semiconductor chip 20 is flip-chip mounted on the wiring board 10 in a face-down manner. For example, the upper surface of the wiring layer 18 of the wiring board 10 and the lower surfaces of the electrodes 201 of the semiconductor chip 20 are aligned via solders, which become the bumps 40, and the bumps 40 are formed by performing a reflow process to melt and solidify the solder. With this, the wiring layer 18 and the electrodes 201 are electrically connected with each other via the bumps 40.

Figure 4B:
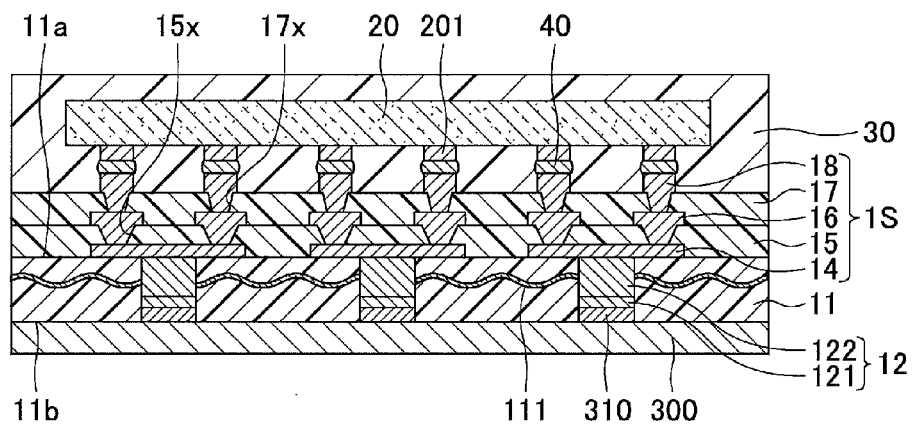

Next, in a step illustrated in FIG. 4B, the sealing resin 30 that covers the upper surface of the layered structure 1S of the wiring board 10 and the semiconductor chip 20 is formed on the layered structure 1S of the wiring board 10. For example, when so called thermosetting mold resin is used as the material of the sealing resin 30, the structure illustrated in FIG. 4A is accommodated in a die, predetermined pressure is applied into the die, and flowing mold resin is introduced into the die. Thereafter, by heating the mold resin at predetermined temperature and curing it, the sealing resin 30 is formed. For a method of filling the mold resin, transfer molding, compression molding, injection molding or the like may be used, for example.

Figure 4C:
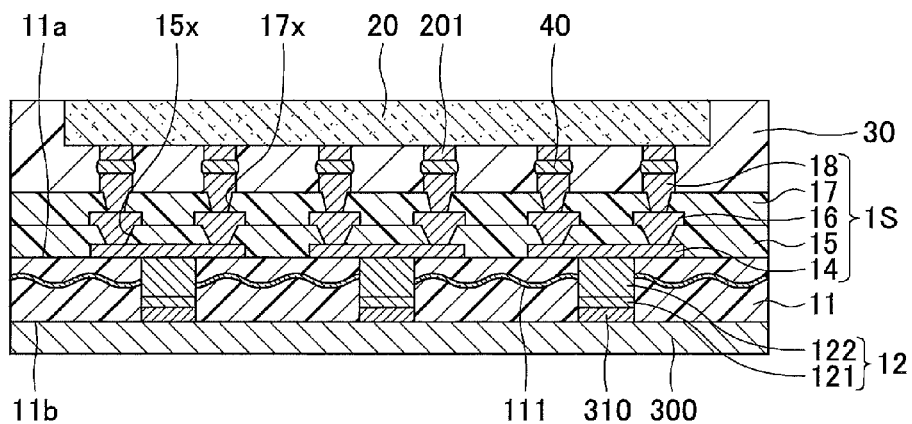

Next, in a step illustrated in FIG. 4C, a back surface of the semiconductor chip 20 is exposed from an upper surface of the sealing resin 30 by grinding the sealing resin 30 from the upper surface side. For grinding, a back grinder or the like may be used, for example. At this time, the back surface of the semiconductor chip 20 may be also grinded with the sealing resin 30 to make the semiconductor chip 20 thin. The upper surface of the sealing resin 30 and the back surface of the semiconductor chip 20 are substantially flush with each other.

Figure 5A:
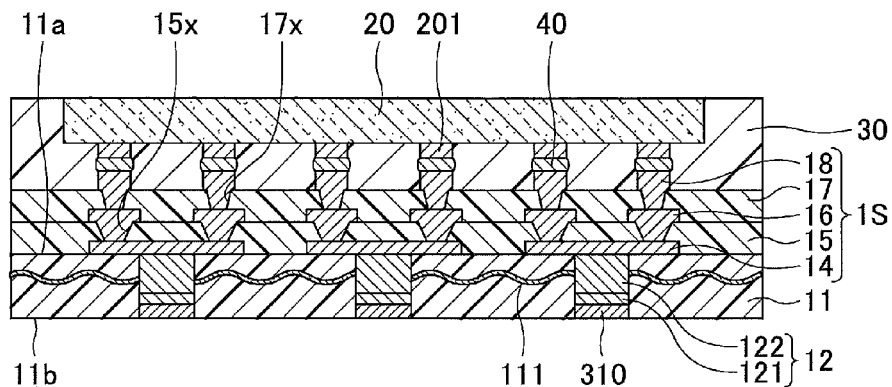
FIG. 5A to FIG. 5C are views (No. 4) illustrating an example of manufacturing steps of the semiconductor device of the first embodiment.

Next, in a step illustrated in FIG. 5A, the support body 300 illustrated in FIG. 4C is removed. The support body 300, which is a copper foil, can be removed by wet etching using ferric chloride solution, copper(II) chloride solution, ammonium persulfate solution or the like, for example. At this time, the metal layer 310 made of titanium functions as an etching stopper layer.

Figure 5B:
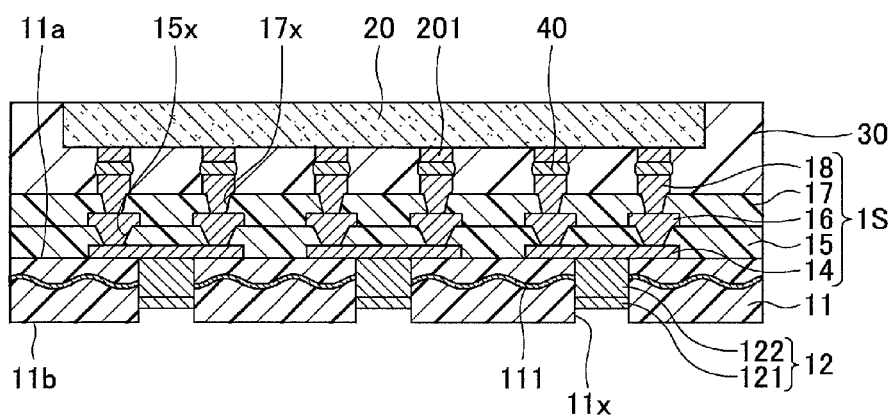

Next, in a step illustrated in FIG. 5B, the metal layer 310 is removed. With this, the other end surface of each of the through wirings 12 is exposed at a position that is concaved from the other surface 11b of the insulating layer 11, and the first concave portion 11x, in which the other end surface of the respective through wiring 12 forms a bottom surface and the insulating layer 11 forms an inner side surface, is formed.

The metal layer 310 made of titanium may be removed by dry etching using etching gas such as carbon tetrafluoride ($CF_4$), for example. Further, the metal layer 310 made of titanium may be removed by wet etching using etching solution such as potassium hydroxide (KOH) based etching solution, for example. In such a case, when the metal layer 121 is made of copper, the metal layer 121 can function as an etching stopper layer.

Figure 5C:
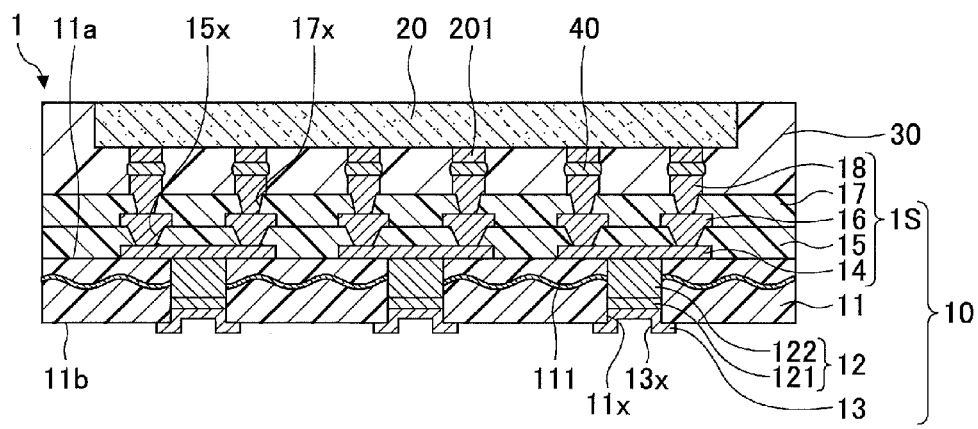

Next, in a step illustrated in FIG. 5C, the pads 13 are formed at the other surface 11b of the insulating layer 11. Similar to the wiring layer 14, the pads 13 may be formed by a semi-additive method. Each of the pads 13 is formed along the bottom surface and the inner side surface of the respective first concave portion 11x, and extends from the inner side surface of the first concave portion 11x to the other surface 11b of the insulating layer 11 around the first concave portion 11x. Then, the second concave portion 13x, which is concaved toward the through wiring 12, is formed at inside of the portion of the pad 13 that extends at the other surface 11b of the insulating layer 11. By the above described steps, the semiconductor device 1 illustrated in FIG. 1A to FIG. 10 is completed.

As such, the wiring board 10 of the semiconductor device 1 has a vertically asymmetric structure in which the layered structure 1S including the fine wiring layers is formed on the one surface 11a of the insulating layer 11 of a single layer which is made of non-photosensitive resin including the reinforcing member 111 such as the glass cloth. However, by providing the reinforcing member 111 in the insulating layer 11, and the center position of the reinforcing member 111 is shifted from the center position of the insulating layer 11 in the thickness direction toward the one surface 11a of the insulating layer 11.

With this, the reinforcing member 111 such as the glass cloth whose rigidity is high can be positioned closer to the center of the wiring board 10 in the thickness direction. Thus, the wiring board 10 can be made closer to a vertically symmetric structure in which the reinforcing member 111 is positioned at the center. Therefore, warping of the wiring board 10 can be reduced. In particular, when the reinforcing member 111 is positioned at the center of a combination of the insulating layer 11 and the layered structure 1S, an effect of reducing warping becomes significantly large.

Further, by using a single layer of the insulating layer 11 made of non-photosensitive resin, and providing only the through wirings 12 and the pads 13 in the insulating layer 11, a ratio of volume of wirings (copper) in the insulating layer 11 can be made closer to a ratio of volume of wirings (copper) in the layered structure 1S, and an effect of reducing warping can be furthermore improved.

Further, by using a single layer of the insulating layer 11 made of non-photosensitive resin, the wiring board 10 can be made thin in total.

Further, according to the semiconductor device 1, each of the pads 13 is formed along the bottom surface and the inner side surface of the respective first concave portion 11x, and extends from the inner side surface of the first concave portion 11x to the other surface 11b of the insulating layer 11 around the first concave portion 11x. Then, the second concave portion 13x, which is concaved toward the through wiring 12, is formed at inside of the portion of the pad 13 that extends at the other surface 11b of the insulating layer 11. With this, reliability in connection when connecting the semiconductor device 1 to the mounting substrate by solder can be improved. This is described in the following with reference to FIG. 6A and FIG. 6B.

Figure 6A:
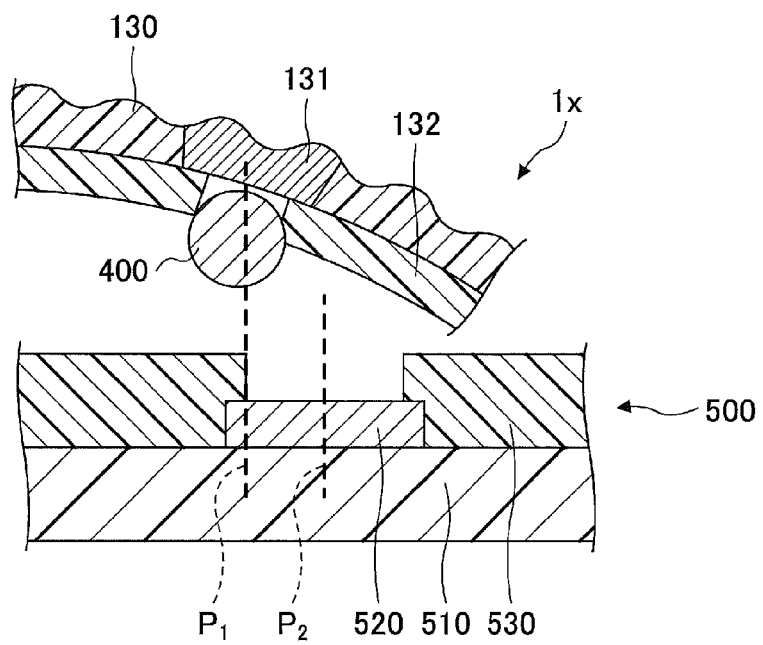
FIG. 6A and FIG. 6B are views for describing effects of the semiconductor device of the first embodiment.
Figure 6B:
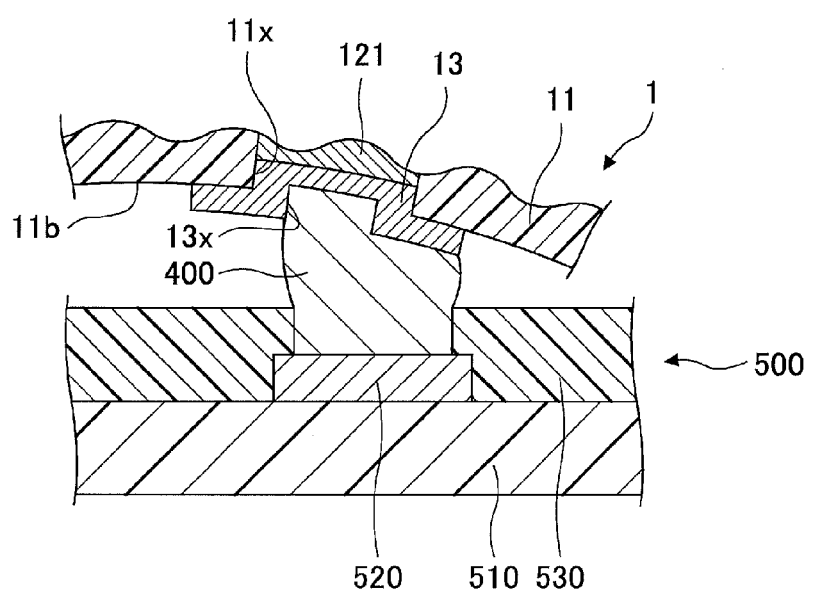

FIG. 6A illustrates a semiconductor device 1x of a comparative example. Meanwhile, FIG. 6B illustrates the semiconductor device 1 of the first embodiment.

In the semiconductor device 1x of the comparative example, a pad 131 for external connection and a solder resist layer 132 that selectively exposes the pad 131 are formed on an insulating layer 130. Here, it is assumed that the semiconductor device 1x is mounted on a mounting substrate 500 by a solder 400. In the mounting substrate 500, a pad 520 and a solder resist layer 530 that selectively exposes the pad 520 are formed on an insulating layer 510.

If the semiconductor device 1x is warped as illustrated in FIG. 6A, a center position $P_1$ or the pad 131 and a center position $P_2$ or the pad 520 are shifted from each other. Thus, it is difficult to connect the pad 131 and the pad 520 by the solder 400.

Meanwhile, even if the wiring board 10 is warped for a bit, according to the embodiment, lowering of a reliability in connection between the semiconductor device 1 and the mounting substrate 500 can be suppressed. As illustrated in FIG. 6B, the pad 13 is formed to have a shape such that the second concave portion 13x of the pad 13 function as a receiver of the solder 400, and the solder 400 wet-spreads from the second concave portion 13x to the surface of the pad 13 that is extended at the other surface 11b of the insulating layer 11. With this, even if the wiring board 10 is warped for a bit, and a center position of the pad 13 and a center position of the pad 520 are shifted from each other, the solder 400 can be bonded with the pad 13 and the pad 520 with larger areas, respectively. As a result, the reliability in connection between the semiconductor device 1 and the mounting substrate 500 can be sufficiently improved.

Second Embodiment

According to a second embodiment, an example is described in which the side surface of the through wiring 12, the inner side surface of the first concave portion 11x of the insulating layer 11 and the other surface 11b of the insulating layer 11 are roughened. In the explanation of the drawings, the same components already described above are given the same reference numerals, and explanations may not be repeated in the second embodiment.

Figure 7A:
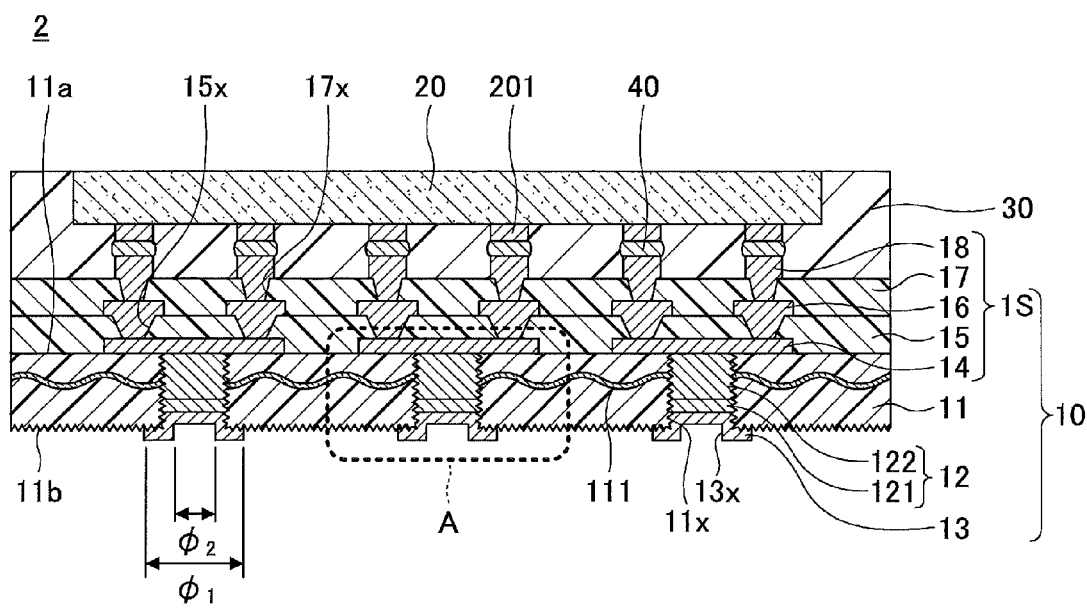
FIG. 7A and FIG. 7B are views illustrating an example of a semiconductor device of a second embodiment.
Figure 7B:
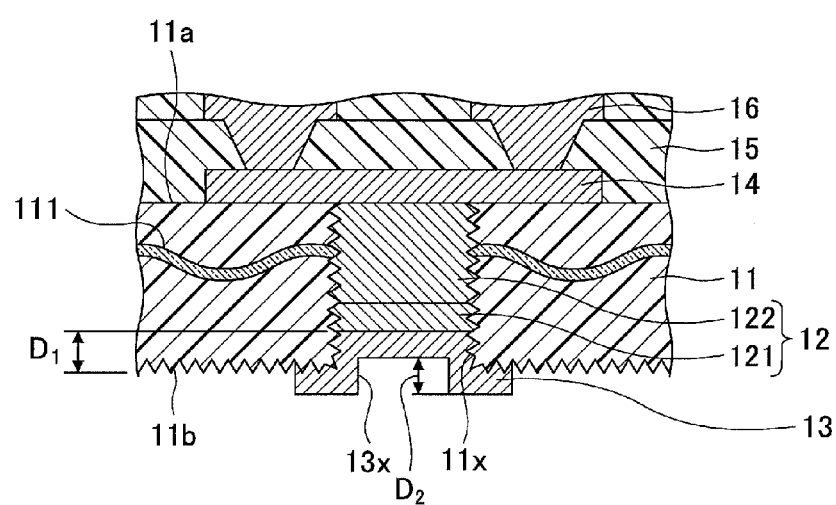

FIG. 7A and FIG. 7B are cross-sectional views illustrating an example of a semiconductor device 2 of the second embodiment. With reference to FIG. 7A and FIG. 7B, the semiconductor device 2 is different from the semiconductor device 1 in that the side surface of the through wiring 12, the inner side surface of the first concave portion 11x of the insulating layer 11 and the other surface 11b of the insulating layer 11 are roughened surfaces, respectively.

FIG. 8A to FIG. 8E are views illustrating an example of manufacturing steps of the semiconductor device 2 of the second embodiment. First, in a step illustrated in FIG. 8A, by performing the steps similar to the steps as described above in the first embodiment with reference to FIG. 2A to FIG. 2D, the metal layer 310 (metal layer portions) and the through wirings 12 each including the metal layers 121 and 122 are stacked at predetermined areas of the one surface of the support body 300.

Figure 8A:
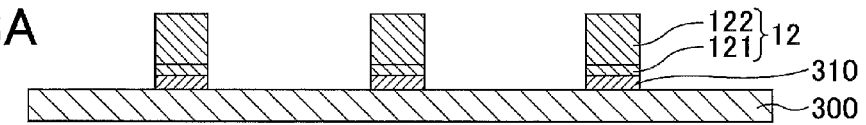
FIG. 8A to FIG. 8E are views (No. 1) illustrating an example of manufacturing steps of the semiconductor device of the second embodiment.
Figure 8B:
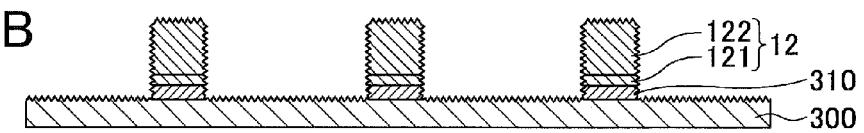

Next, in a step illustrated in FIG. 8B, the side surface of the metal layer 310, the one end surface and the side surface of each of the through wirings 12 and the one surface of the support body 300 are roughened. Roughing may be performed by chemical etching, for example. The roughness of each of the side surface of the metal layer 310, the one end surface and the side surface of each of the through wirings 12 and the upper surface of the support body 300, after being roughened, may be about Ra 0.1 to 0.4 nm, for example.

Figure 8C:
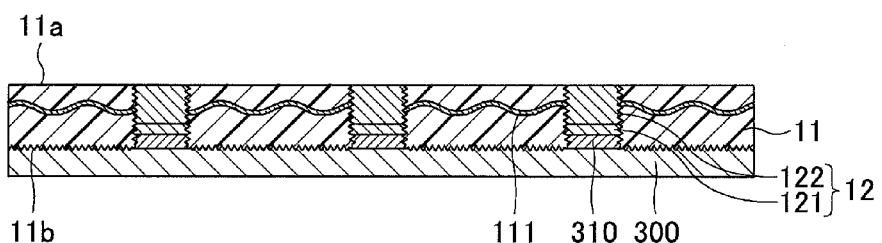

Next, in a step illustrated in FIG. 8C, steps similar to the steps of FIG. 2E and FIG. 2F of the first embodiment are performed. In these steps, as the one surface 11a of the insulating layer 11 and the one end surface of each of the through wirings 12 are polished, the one end surface of each of the through wirings 12 becomes a flat surface from the roughened surface. The side surface of the metal layer 310, the side surface of each of the through wirings 12 and the one surface of the support body 300 are remained roughened surfaces.

Figure 8D:
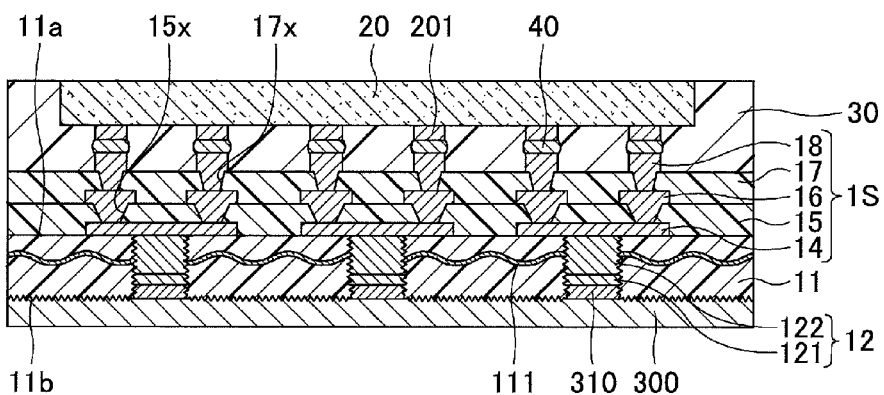
Figure 8E:
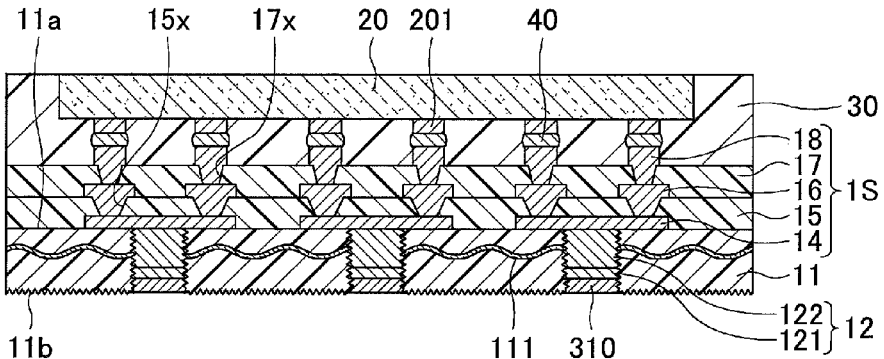

Next, in a step illustrated in FIG. 8D, steps similar to the steps of FIG. 2G to FIG. 4C of the first embodiment are performed. Next, in a step illustrated in FIG. 8E, the support body 300 illustrated in FIG. 8D is removed by a step similar to the step illustrated in FIG. 5A. With this, concavo-convex (roughened surface) formed at the one surface of the support body 300 in the step of FIG. 8B is transferred to the other surface 11b of the insulating layer 11 so that the other surface 11b of the insulating layer 11 becomes a roughened surface as well.

Figure 9A:
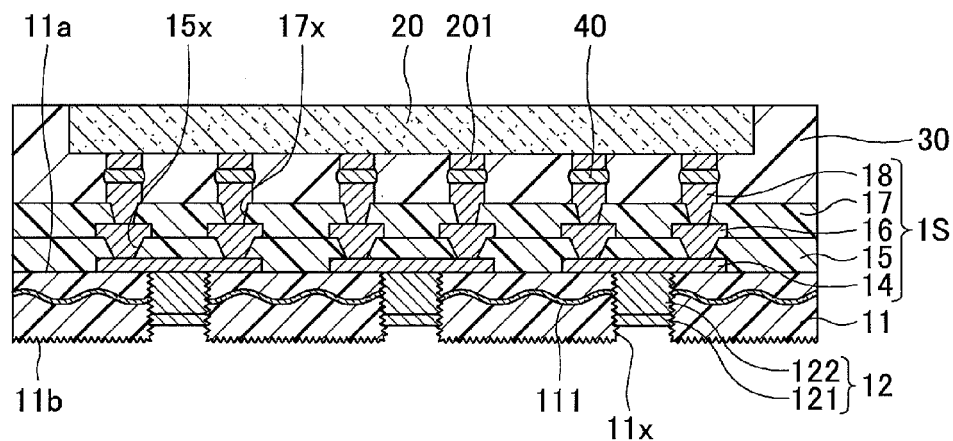
FIG. 9A and FIG. 9B are views (No. 2) illustrating an example of manufacturing steps of the semiconductor device of the second embodiment.
Figure 9B:
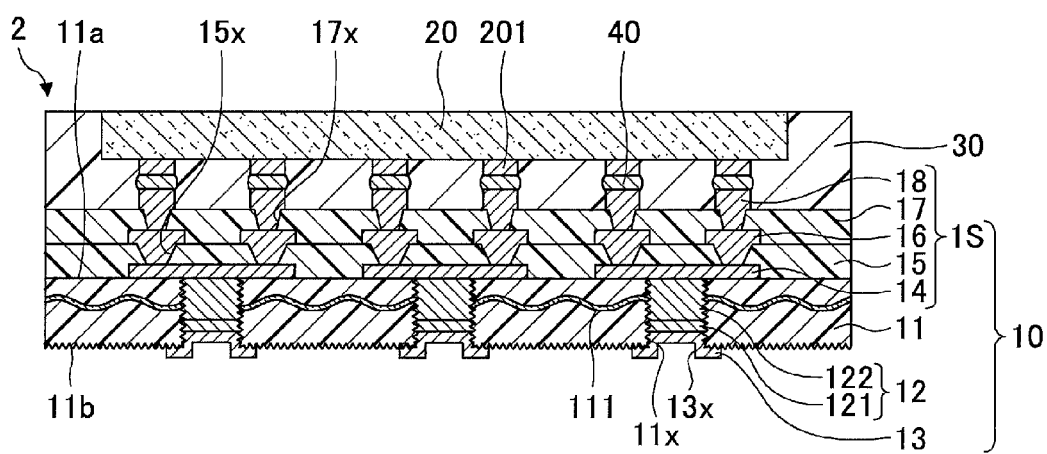

Next, in steps illustrated in FIG. 9A and FIG. 9B, the semiconductor device 2 illustrated in FIG. 7A and FIG. 7B is formed by performing steps similar to the steps of FIG. 5B and FIG. 5C of the first embodiment.

As such, in the semiconductor device 2, the side surface of each of the through wirings 12, the inner side surface of each of the first concave portions 11x of the insulating layer 11 and the other surface 11b of the insulating layer 11 are roughened surfaces. With this, adhesion between the side surface of each of the through wirings 12 and the insulating layer 11 can be improved. Further, adhesion between each of the pads 13 and the insulating layer 11 can be improved. Further, as the adhesion between each of the pads 13 and the insulating layer 11 is improved, generation of cracks on the pads 13 can be prevented when heat stress is applied on the pads 13.

Third Embodiment

In a third embodiment, an example is described in which a part of each of the through wirings 12 has an inverse cone trapezoid shape. In the explanation of the drawings, the same components already described above are given the same reference numerals, and explanations may not be repeated in the third embodiment.

Figure 10A:
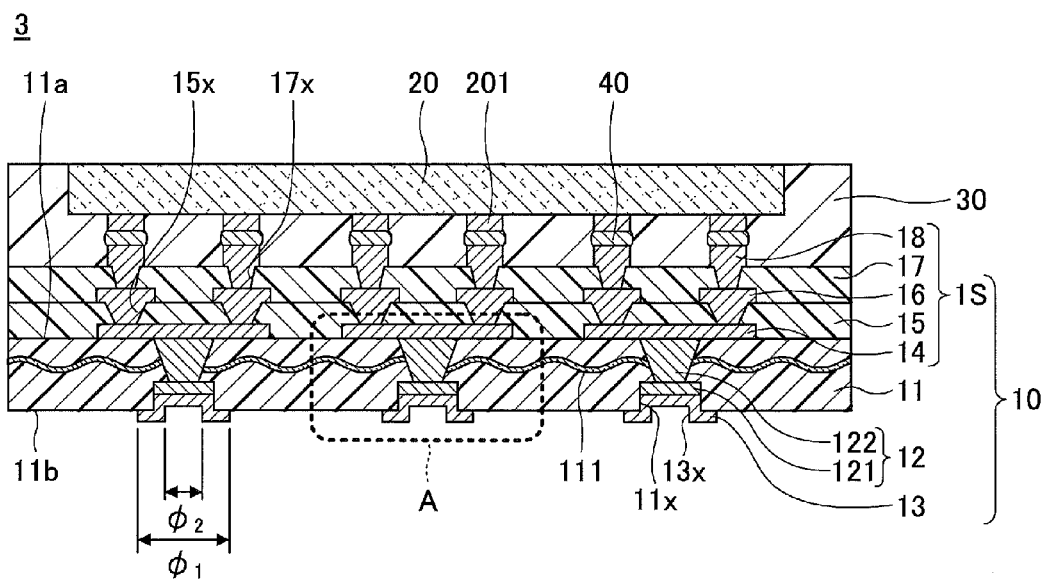
FIG. 10A and FIG. 10B are views illustrating an example of a semiconductor device of a third embodiment.
Figure 10B:
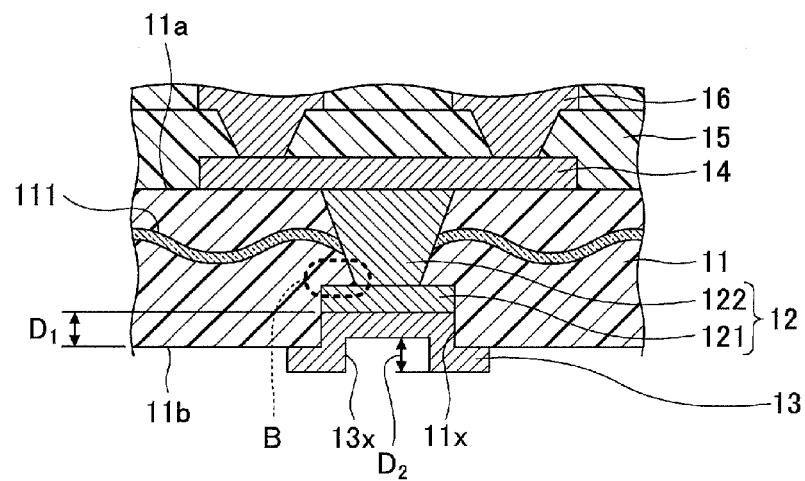

FIG. 10A and FIG. 10B are cross-sectional views illustrating an example of a semiconductor device 3 of the third embodiment. FIG. 10A is a cross-sectional view, and FIG. 10B is an enlarged cross-sectional view of a portion "A" in FIG. 10A. With reference to FIG. 10A and FIG. 10B, the semiconductor device 3 is different from the semiconductor device 1 in that the metal layer 122 of each of the through wirings 12 has an inverse cone trapezoid shape.

In the semiconductor device 3, as illustrated as a portion "B" in FIG. 10B, the upper surface of the metal layer 121 at outer periphery is exposed around the metal layer 122. The exposed upper surface of the metal layer 121 at outer periphery contacts the insulating layer 11.

FIG. 11A to FIG. 11D and FIG. 12A to FIG. 12C are views illustrating an example of manufacturing steps of the semiconductor device 3 of the third embodiment. First, in a step illustrated in FIG. 11A, the support body 300 is prepared, and a resist layer 330 (dry film resist or the like) provided with open portions 330x at forming areas for the through wirings 12 is formed at the one surface of the support body 300.

Figure 11A:
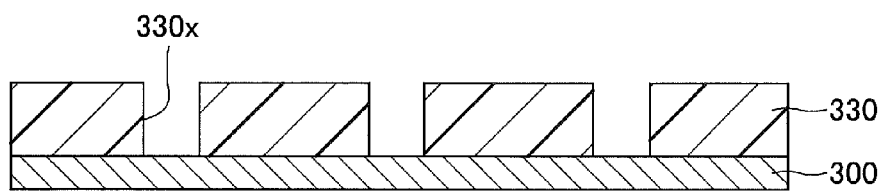
FIG. 11A to FIG. 11D are views (No. 1) illustrating an example of manufacturing steps of the semiconductor device of the third embodiment.
Figure 11B:
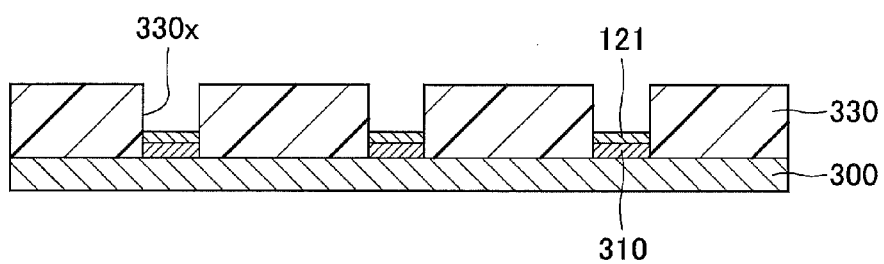
Figure 11C:
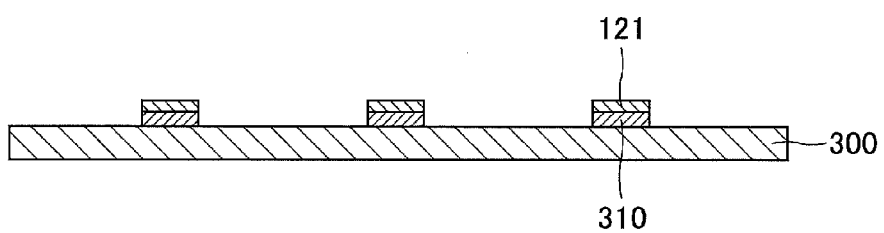

Next, in a step illustrated in FIG. 11B, the metal layer 310 and the metal layer 121 are stacked in this order at the one surface of the support body 300 which is exposed in each of the open portions 330x by an electrolytic plating method using the support body 300 as a power supply layer. Next, in a step illustrated in FIG. 11C, the resist layer 330 is removed by peeling solution.

Figure 11D:
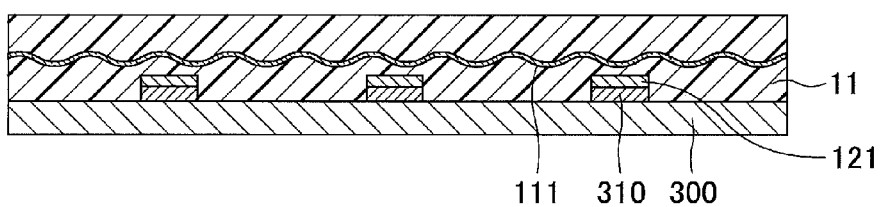

Next, in a step illustrated in FIG. 11D, similar to the step of FIG. 2E, the insulating layer 11 made of non-photosensitive resin, which is a single layer including the reinforcing member 111, is formed on the one surface of the support body 300 such that to cover the side surface of the metal layer 310 and the one end surface and the side surface of each of the through wirings 12. At this stage, the center position of the reinforcing member 111 substantially matches the center position of the insulating layer 11 in the thickness direction.

Figure 12A:
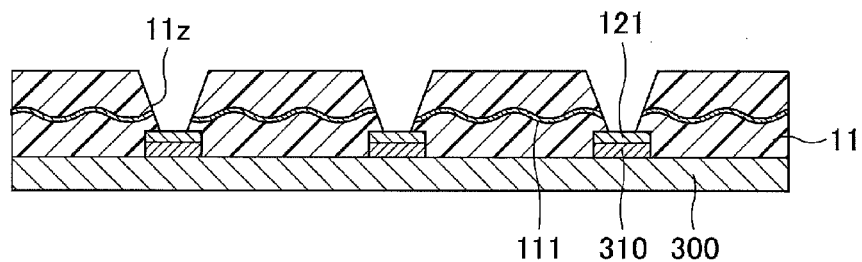
FIG. 12A to FIG. 12C are views (No. 2) illustrating an example of manufacturing steps of the semiconductor device of the third embodiment.

Next, in a step illustrated in FIG. 12A, via holes 11z that penetrate the insulating layer 11 and expose the upper surface of the metal layer 121 are formed in the insulating layer 11. The via holes 11z may be formed by laser processing using $CO_2$ laser or the like, for example. Each of the via holes 11z is a concave portion having an inverse cone trapezoid shape in which a diameter of an open portion open to an opposite side of the metal layer 121 is larger than a diameter of a bottom surface at the upper surface of the metal layer 121.

Figure 12B:
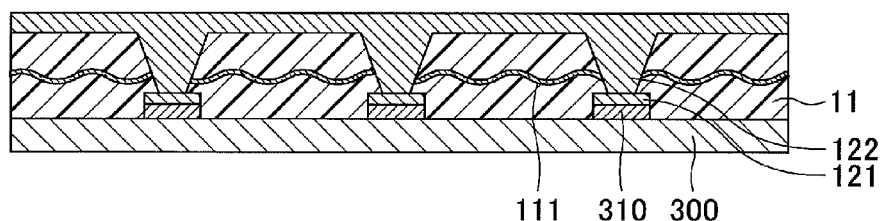

Next, in a step illustrated in FIG. 12B, the metal layer 122 that fills the via holes 11z and extends on the one surface of the insulating layer 11 to cover the entirety of the one surface of the insulating layer 11 is formed. The metal layer 122 may be formed by a semi-additive method, for example. Specifically, first, a seed layer that continuously covers the one surface of the insulating layer 11 and an inner wall surface and a bottom surface of each of the via holes 11z is formed by a sputtering method or an electroless plating method. Next, an electrolytic plating layer that fills the via holes 11z and extends on the one surface of the insulating layer 11 to cover the entirety of the one surface of the insulating layer 11 is formed on the seed layer by an electrolytic plating method using the seed layer as a power supply layer. With this, the metal layer 122 in which the electrolytic plating layer is stacked on the seed layer is formed.

Figure 12C:
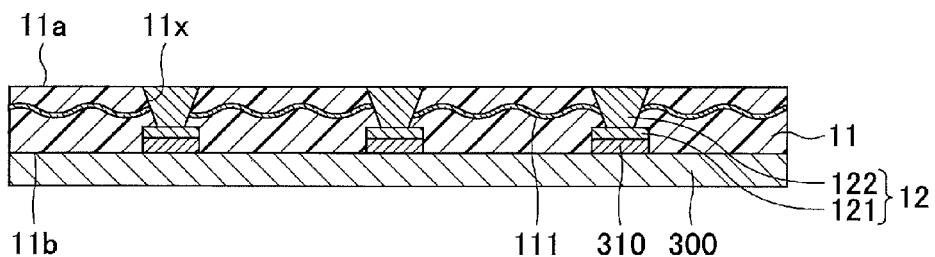

Next, in a step illustrated in FIG. 12C, similar to the step of FIG. 2F, the upper surface of the metal layer 122 is polished to remove the metal layer 122 that extends on the one surface 11a of the insulating layer 11 and expose the upper surface of the metal layer 122 in each of the via holes 11z. The one surface 11a of the insulating layer 11 and the upper surface of the metal layer 122 become substantially flush with each other. With this, the center position of the reinforcing member 111 is shifted from the center position of the insulating layer 11 in the thickness direction toward the one surface 11a of the insulating layer 11. It is preferable that the polished amount of the insulating layer 11 is adjusted such that the center position of the reinforcing member 111 matches the center position of a combination of the insulating layer 11 and the layered structure 1S, when the layered structure 1S is formed in the following step, in the thickness direction.

Next, by performing steps similar to the steps of FIG. 2G to FIG. 5C of the first embodiment, the semiconductor device 3 illustrated in FIG. 10A and FIG. 10B is formed.

As such, in the semiconductor device 3, as illustrated in FIG. 10B, the upper surface of the metal layer 121 at outer periphery is exposed around the metal layer 122 and contacts the insulating layer 11. Thus, contacting area between the metal layer 121 and the insulating layer 11 is increased and removal between the metal layer 121 and the insulating layer 11 can be prevented. Other effects are the same as those of the first embodiment.

(Simulation)

Simulation (25° C.) for measuring a warping amount was performed for each of the wiring board 10 (illustrated as "example" in FIG. 13) and a wiring board of a comparative example. Copper was used for the material of the through wirings 12 and the pads 13 of the wiring board 10.

The wiring board of the comparative example had a structure in which a layered structure corresponding to the layered structure 1S of the wiring board 10 is formed on a stacked layer of three insulating layers made of non-photosensitive resin (corresponding to the insulating layer 11 of the wiring board 10). Here, different from the wiring board 10, through wirings (copper) and a wiring pattern (copper) were formed in each of the insulating layers made of non-photosensitive resin.

Figure 13:
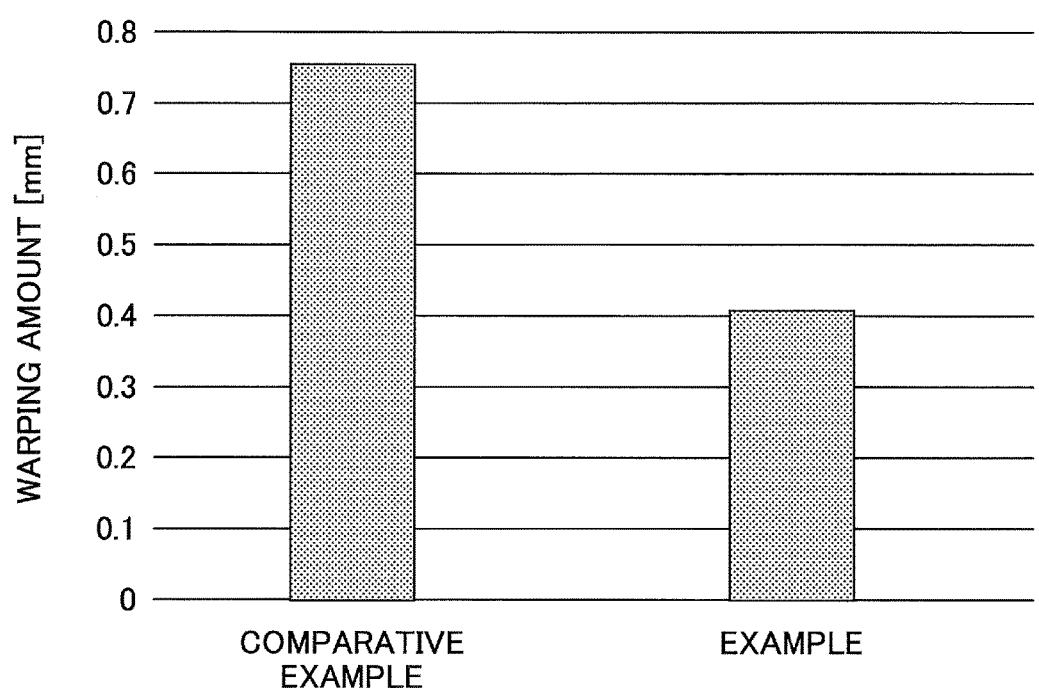
FIG. 13 is a view illustrating simulation results.

Results of the simulation are illustrated in FIG. 13. As illustrated in FIG. 13, for the wiring board 10 (example), the warping amount was about 0.4 mm, while for the wiring board of the comparative example, the warping amount was about 0.75 mm.

From these results, it was confirmed that the warping amount can be reduced for the structure of the wiring board 10 in which a single layer of the insulating layer 11 made of non-photosensitive resin was used, and only the through wirings 12 and the pads 13 were formed in the insulating layer 11, compared with the structure of the comparative example in which a plurality of insulating layers made of non-photosensitive resin were used, and the through wirings and the wiring pattern were formed in each of the insulating layers.

If the through wirings and the wiring pattern are formed in the insulating layer made of non-photosensitive resin whose thickness is thicker than the insulating layer (photosensitive resin layer) of the layered structure 1S as the wiring board of the comparative example, inevitably, a ratio of volume of copper in the insulating layer made of non-photosensitive resin becomes higher. If a plurality of such insulating layers in which a ratio of volume of copper is high are stacked, difference from a ratio of volume of copper in the insulating layer (photosensitive resin layer) of the layered structure 1S becomes large. As a result, it can be estimated, that such difference causes the warping of the wiring board of the comparative example to become large.

In other words, according to the wiring board 10, it can be considered that by using a single layer of the insulating layer 11 made of non-photosensitive resin, and forming only the through wirings 12 and the pads 13 in the insulating layer 11, a ratio of volume of the wiring (copper) in the insulating layer 11 can be made closer to a ratio of volume of the wiring (copper) in the layered structure 1S, and the warping can be reduced.

According to the embodiment, a wiring board capable of reducing warping, and suppressing lowering of reliability in connection even when an alignment between pads for external connection and a mounting substrate is shifted is provided.

Although a preferred embodiment of the wiring board and the semiconductor device has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, after the step of FIG. 3E, only the wiring board 10 may be manufactured by performing the steps of FIG. 5A to FIG. 5C without performing the steps of FIG. 4A to FIG. 4C. At this time, a second support body may be provided on the layered structure 1S before removing the support body 300 in the step of FIG. 5A.

Further, for example, the back surface of the semiconductor chip 20 may be covered by the sealing resin 30.

Further, the through wiring 12 may have a cone trapezoid shape in which a diameter at the one surface 11a of the insulating layer 11 is smaller than a diameter at the other surface 11b, instead of a columnar shape, for example.

Further, for the material of the insulating layer 15 or the insulating layer 17, insulating non-photosensitive resin whose main constituent is epoxy resin or the like may be used, for example, instead of using insulating photosensitive resin whose main constituent is phenol-based resin, polyimide-based resin or the like, for example.

Various aspects of the subject-matter described herein are set out non-exhaustively in the following numbered clauses:

1. A method of manufacturing a wiring board including:
    forming a metal layer portion and a through wiring to be stacked on the metal layer portion on a surface of a support body;
    forming a first insulating layer made of a single layer of non-photosensitive resin including a reinforcing member on the surface of the support body such that to cover a side surface of the metal layer portion and a first end surface and a side surface of the through wiring;
    polishing a first surface of the first insulating layer to expose the first end surface of the through wiring from the first surface of the first insulating layer, and make a center position of the reinforcing member to be positioned on a side toward the first surface of the first insulating layer with respect to a center of the first insulating layer in a thickness direction of the first insulating layer;
    forming a layered structure, in which a wiring layer and an insulating layer are stacked, on the first surface of the first insulating layer;
    removing the support body to expose a second surface of the first insulating layer that is opposite to the first surface;
    removing the metal layer portion to form a first concave portion by the through wiring and the first insulating layer at the second surface of the first insulating layer, in which a second end surface of the through wiring is exposed at a position concaved from the second surface of the first insulating layer, the second end surface of the through wiring forming a bottom surface of the first concave portion and the first insulating layer forming an inner side surface of the first concave portion; and
    forming a pad for external connection at the second surface of the first insulating layer at a position corresponding to the through wiring, the pad for external connection being formed along the bottom surface and the inner side surface of the first concave portion, and extending on the second surface of the first insulating layer around the first concave portion, only the pad for external connection being formed on the second surface of the first insulating layer, the pad for external connection having a second concave portion formed so as to be concaved toward the through wiring within a part of the pad for external connection extended on the second surface of the insulating layer.

2. The method of manufacturing the wiring board according to clause 1, further comprising:
    between the forming the metal layer portion and the through wiring, and the forming the first insulating layer on the surface of the support body, roughening the surface of the support body, a side surface of the metal layer portion, and the first end surface and the side surface of the through wiring,
    wherein in the removing the support body, concavo-convex formed at the surface of the support body in the roughening is transferred to the second surface of the first insulating layer.

3. A method of manufacturing a semiconductor device comprising:
    the method of manufacturing the wiring board according to clause 1;
    between the forming the layered structure and the removing the support body,
        mounting a semiconductor chip on the layered structure to be connected to an uppermost wiring layer of the layered structure; and
        forming sealing resin that seals the semiconductor chip on the layered structure.

What is claimed is:

1. A wiring board comprising:
a first insulating layer made of a single layer of non-photosensitive resin including a reinforcing member, the first insulating layer including a first surface and a second surface opposite to the first surface, a center position of the reinforcing member being positioned on a side toward the first surface with respect to a center of the first insulating layer in a thickness direction of the first insulating layer;
a layered structure, in which a wiring layer and a second insulating layer are stacked, stacked on the first surface of the first insulating layer;
a through wiring provided to penetrate the first insulating layer, the through wiring including a first end surface and a second end surface opposite to the first end surface, the first end surface of the through wiring being exposed from the first surface of the first insulating layer to be connected to the wiring layer, the through wiring and the first insulating layer forming a first concave portion at the second surface of the first insulating layer, in which the second end surface of the through wiring is exposed at a position concaved from the second surface of the first insulating layer, the second end surface of the through wiring forming a bottom surface of the first concave portion and the first insulating layer forming an inner side surface of the first concave portion; and
a pad for external connection formed on the second surface of the first insulating layer at a position corresponding to the through wiring, the pad for external connection being formed along the bottom surface and the inner side surface of the first concave portion, and extending on the second surface of the first insulating layer around the first concave portion, only the pad for external connection being formed on the second surface of the first insulating layer, the pad for external connection having a second concave portion formed so as to be concaved toward the through wiring within a part of the pad for external connection extended on the second surface of the first insulating layer.

2. The wiring board according to claim 1, wherein the first surface of the first insulating layer and the first end surface of the through wiring are substantially flush with each other.

3. The wiring board according to claim 1, wherein the first surface of the first insulating layer and the first end surface of the through wiring are polished surfaces.

4. The wiring board according to claim 1, wherein the layered structure includes a plurality of the wiring layers and a plurality of the second insulating layers,
the plurality of wiring layers including a first wiring layer directly formed on the first surface of the first insulating layer,
the first wiring layer being bonded to the first end surface of the through wiring, and
the second insulating layers of the layered structure being made of photosensitive resin.

5. The wiring board according to claim 1,
wherein the second insulating layer of the layered structure is made of photosensitive resin, and
wherein the wiring layer of the layered structure is a fine wiring layer.

6. The wiring board according to claim 1, wherein the first surface of the first insulating layer is smoother than the second surface of the first insulating layer.

7. The wiring board according to claim 1, wherein the center position of the reinforcing member is positioned at center of a combination of the first insulating layer and the layered structure in the thickness direction.

8. The wiring board according to claim 1, wherein a side surface of the through wiring, the inner side surface of the first concave portion and the second surface of the first insulating layer are roughened surfaces, respectively.

9. The wiring board according to claim 1, wherein a portion of the second surface of the pad for external connection formed on the second end surface of the through wiring is positioned closer to the first surface of the first insulating layer than a portion of the second surface of the pad for external connection formed on the second surface of the first insulating layer.

10. A semiconductor device comprising:
the wiring board according to claim 1;
a semiconductor chip mounted on the layered structure, and connected with an uppermost wiring layer of the layered structure; and
sealing resin, formed on the layered structure, that seals the semiconductor chip.

11. The wiring board according to claim 1, wherein the first insulating layer is an outermost layer of the wiring board, and the second surface of the first insulating layer is exposed.

12. The wiring board according to claim 1, wherein the bottom surface of the first concave portion is only formed by the second end surface of the through wiring.

13. The wiring board according to claim 1, wherein an external shape of the pad for external connection is larger than an external shape of the first concave portion, in a planar view.

14. The wiring board according to claim 1,
wherein the through wiring includes
a first metal layer including the first end surface that is exposed from the first surface of the first insulating layer and is connected to the wiring layer, and a third end surface opposite to the first end surface, and
a second metal layer including the second end surface that forms the bottom surface of the first concave portion, and a fourth end surface opposite to the second end surface,
wherein the first metal layer at the first end surface is made larger than the first metal layer at the third end surface, and
wherein the second metal layer at the fourth end surface is made larger than the first metal layer at the third end surface, and the second metal layer at the fourth end surface contacts the first metal layer at the third end surface and the first insulating layer.

15. The wiring board according to claim 14,
wherein the first metal layer has a circular shape, and a diameter of the first metal layer at the first end surface is made larger than a diameter of the first metal layer at the third end surface.

* * * * *